United States Patent [19]

Miki et al.

[11] 4,149,149

[45] Apr. 10, 1979

[54] CIRCUIT FOR ACTUATING A DISPLAY WITH AN IMPROVED COMPARATOR

[75] Inventors: Masayuki Miki; Nobuaki Miyakawa, both of Ibaraki, Japan

[73] Assignee: Hitachi, Ltd., Japan

[21] Appl. No.: 768,346

[22] Filed: Feb. 14, 1977

[30] Foreign Application Priority Data

Feb. 20, 1976 [JP] Japan .................................. 51-17052

[51] Int. Cl.² .......................................... G01D 7/00
[52] U.S. Cl. .................................... 340/753; 307/361; 328/148; 324/96; 340/172; 340/803
[58] Field of Search .......... 340/324 R, 324 M, 378 R, 340/172; 324/96, 122; 307/360, 361; 328/148

[56] References Cited

U.S. PATENT DOCUMENTS

| | | | |
|---|---|---|---|
| 3,021,063 | 2/1962 | Kummer | 340/172 X |
| 3,987,392 | 10/1976 | Kugelmann et al. | 340/324 R |
| 4,006,412 | 2/1977 | Campbell et al. | 324/96 |
| 4,028,620 | 6/1977 | Kitagawa et al. | 340/172 X |
| 4,037,153 | 7/1977 | Kalanit | 324/96 X |
| 4,039,859 | 8/1977 | Horninger | 307/361 X |

*Primary Examiner*—David L. Trafton
*Attorney, Agent, or Firm*—Craig & Antonelli

[57] ABSTRACT

In a display circuit for actuating a display having plural liquid crystal segments or luminescent diodes, an improved comparator is provided for determining the number of the display segments to be energized and activated in accordance with an analogue input voltage. The analogue input voltage is applied to one terminal of a resistance having plural resistors connected in series, the other terminal of which is grounded. The comparator is composed of an integrated circuit of MOS type which has plural logical circuits. Each of one input terminals of the logical circuits is connected to a corresponding one of junctions of the resistors connected in series. Each logical circuit of the comparator provides "1" output signal when the voltage at the corresponding junction exceeds a threshold value thereof. An actuator, which is constructed with exclusive OR gates or transistors, energizes the liquid crystal segments or the luminescent diodes in response to the "1" output signals from the comparator.

4 Claims, 16 Drawing Figures

CIRCUIT FOR ACTUATING A DISPLAY WITH AN IMPROVED COMPARATOR

BACKGROUND OF THE INVENTION

This invention relates to a circuit for actuating a display having liquid crystal segments or luminescent diodes in accordance with an analogue input voltage.

In an automobile, a display can be often found which has plural display segments closed of liquid crystal composition or luminescent diodes. For example, a speedometer which employs such display has plural display segments disposed in a straight line or semicircular form on a dashboard of the car. A circuit for actuating such display has a comparing circuit and an actuating circuit. The comparing circuit is provided for determining a number of the display segments to be energized and activated according to an analogue input voltage from a detector, such as a tachogenerator. The actuating circuit is provided for energizing and activating the display segments in response to the output signals form the comparing circuit. According to the prior art, the comparing circuit is constructed with plural unipolar transistors and a resistance which includes plural resistors connected in series. The analogue input voltage is applied to one terminal of the resistance, the other terminal of which is grounded. Each of the junctions of the resistors connected in series is applied to the base of corresponding transistors. Each transistor is turned in when the voltage applied to the base thereof exceeds a threshold value. Each transistor of the comparing circuit provides a output signal at a collector thereof. The actuating circuit energizes and activates the display segments in response to the output signals from the comparing circuit. Accordingly, the display segments of the number in accordance with the analogue input voltage are energized and activated.

Such a circuit, however, has drawbacks as follows. In the case of employing a relatively large number of the display segments, for example when ten display segments are installed, the circuit tends to make an error particularly in small range of the analogue input voltage. That is due to the fact that the threshold voltage of the transistor is relatively small; e.g. on the order of 0.6 volt in case of a silicon N-P-N transistor. In the small range of the analogue input voltage, for example nearly equal to the threshold value, voltages at the junctions of the resistors connected in series come very close to one another. Therefore, a transistor or transistors which should not be turned on are turned on erroneously. Further, the comparing circuit which is constructed with such plural bipolar transistors tends to consume a relatively large amount of electric power. The unipolar transistor also has a drawback that it requires the relatively large area on a semiconductor chip of an integrated circuit. Such comparing circuit is, therefore, not suitable for fabrication in the form of the integrated circuit.

SUMMARY OF THE INVENTION

An object of this invention is to provide an improved display circuit which is free for the drawbacks mentioned above.

In a display circuit for actuating display segments in accordance with an analogue input voltage comprising an input means supplied with the analogue input voltage, a resistance means including a plurality of resistors connected in series for dividing the analogue input voltage, a comparing means for comparing the divided input voltage with the predetermined references to determine the number of the display segments to be activated and an actuating means for driving the display segments in response to the output from said comparing means, said comparing means is composed of a logical circuit of metal oxide semiconductor, the threshold voltage of the semiconductor being utilized for said predetermined references.

BREIF DESCRIPTION OF THE DRAWINGS

DETAILED DESCRIPTION OF PREFERRED EMBODIMENTS

Figure 1:
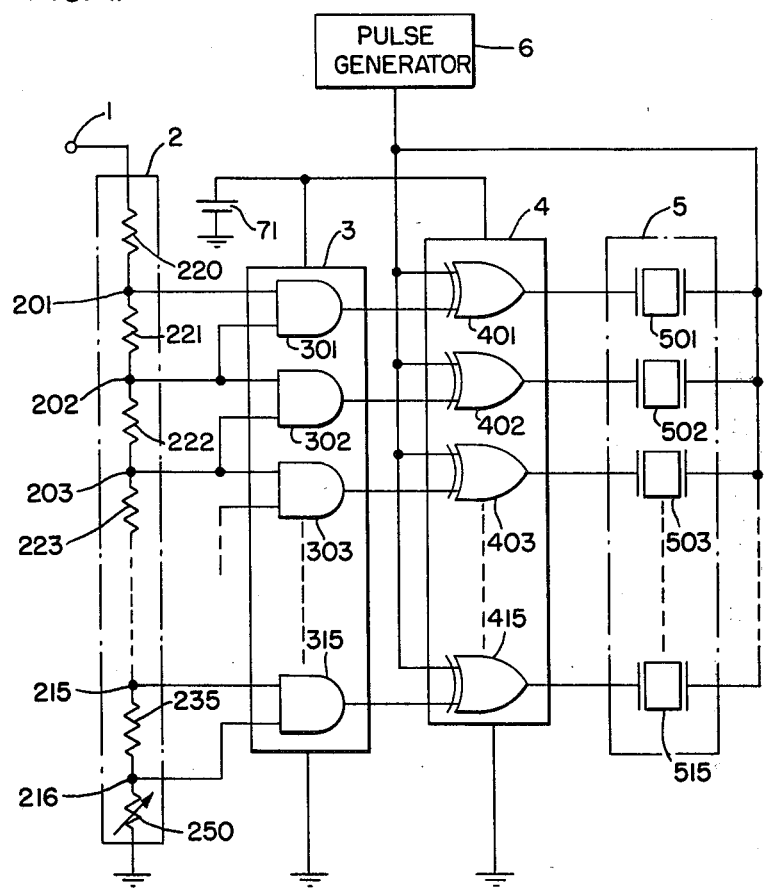
FIG. 1 is a schematic diagram of a circuit for actuating a display having liquid crystal segments, which are constructed in accordance with this invention.

Referring now to FIG. 1, there is illustrated an input terminal 1 to which an analogue input voltage to be indicated is applied. The input terminal 1 is connected to one terminal of a resistance means 2 which includes sixteen resistors 220 to 235 and a variable resistor 250 (those resistors are illustrated partially in the figure). The other terminal of the resistance means 2, that is a lower terminal of the variable resistor 250, is grounded. The analogue input voltge applied to the input terminal 1 is divided by the sixteen resistors 220 to 235 and the variable resistor 250. Sixteen junctions of the resistors 220 to 235 and the variable resistor 250 connected in series are denoted by reference numerals 201 to 216 (those junctions are also illustrated partially). The divided input voltages are applied to an integrated circuit 3 which operates as a comparator. In the integrated circuit 3, there are installed fifteen AND gates 301 to 315 (those AND gates are illustrated partially). Each of the AND gates 301 to 315 is constructed with unipolar transistors, that is field effect transistors. The junctions 201 to 215 except the junction 216 are connected to upper input terminals of the AND gates 301 to 315 respectively. Each of lower input terminals of the AND gates 301 to 315 is connected to corresponding adjacent junctions 202 to 216 except for the junction 201. A positive d.c. voltage supply terminal of the integrated circuit 3 is connected to a d.c. voltage source 71 and a negative one thereof is grounded. Output signals of the comparator 3 are applied to an integrated circuit 4 which operates as a display actuator. The integrated circuit 4 has fifteen exclusive OR gates 401 to 415 which are also constructed with bipolar transistors. All of upper input terminals of the exclusive OR gates 401 to 415 are connected to a pulse generator 6 at an output terminal thereof. Each of lower input terminals of the exclusive OR gates 401 to 415 is connected to output terminal of corresponding AND gates 301 to 315 of the comparator 3. A positive d.c. voltage supply terminal of the integrated circuit 4 is also connected to the d.c. voltage source 71 and a negative one thereof is grounded. Output signals of the display actuator 4 are applied to a display 5 which has fifteen liquid crystal display segments 501 to 515 having two electrodes and liquid crystal composition interposed between the electrodes. Each of the electrodes on the left hand side of the liquid crystal segments 501 to 515 is connected to output terminal of corresponding exclusive OR gates 401 to 415, while all of the electrodes on the right hand side thereof are connected to the pulse generator 6.

In the circuit mentioned above, the resistance values of the resistors 220 to 235 and the variable resistor 250 of the resistance means 2 are selected as described hereinafter.

Resistors 220 to 235; $R_{220} = R_{221} = R_{222} \ldots = 6.8(\Omega)$
Variable resistor 250; $R_{250} - 104.5(\Omega)$ In case the analogue input voltage is $V_{in}$, the voltages at the sixteen junctions of the resistance means 2 are represented by followng equations, respectively.

$$V_{201} = \frac{R_{221} + R_{222} + \ldots + R_{235} + R_{250}}{R_{220} + R_{221} + R_{222} + \ldots + R_{235} + R_{250}} \cdot V_{in} \quad (1)$$

$$V_{202} = \frac{R_{222} + \ldots + R_{235} + R_{250}}{R_{220} + R_{221} + R_{222} + \ldots + R_{235} + R_{250}} \cdot V_{in} \quad (2)$$

$$V_{203} = \frac{R_{223} + \ldots + R_{235} + R_{250}}{R_{220} + R_{221} + R_{222} + \ldots + R_{235} + R_{250}} \cdot V_{in} \quad (3)$$

$$V_{215} = \frac{R_{235} + R_{250}}{R_{220} + R_{221} + R_{222} + \ldots + R_{235} + R_{250}} \cdot V_{in} \quad (4)$$

$$V_{216} = \frac{R_{250}}{R_{220} + R_{221} + R_{222} + \ldots + R_{235} + R_{250}} \cdot V_{in} \quad (5)$$

In those equations (1) to (5), voltages at the junctions 201 to 216 of the resistance 2 are represented by $V_{201}$ to $V_{216}$ respectively.

Figure 2:
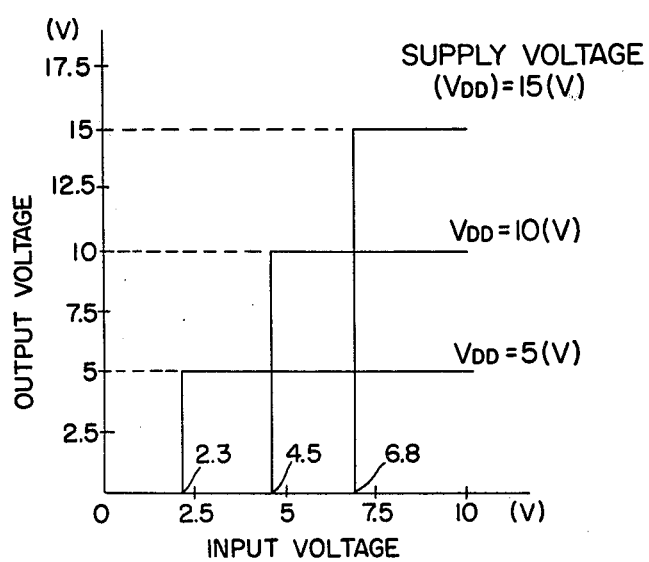
FIG. 2 shows voltage transfer characteristics of a COS/MOS gate which is utilized in the embodiment shown in FIG. 1.

As the comparator 3 and the display actuator 4, complementary metal oxide semiconductor digital integrated circuit (COS/MOS digital integrated circuit) is utilized For example, COS/MOS AND gates of CD4081B type (made by RCA corporation U.S.A.) is used as th comparator 3. Threshold value of the COS/MOS AND gate, that is input voltage enough to turn on the COS/MOS AND gate, varies depending on the d.c. supply voltage ($V_{DD}$) of the d.c. voltage source 71. As shown in FIG. 2, the COS/MOS AND gate is turned on by the input voltage greater than 2.3 (volt) when the d.c. supply voltage ($V_{DD}$) is selected at 5(volt). The COS/MOS AND gate is turned on by the input voltage greater than 6.8 (volt) when the d.c. supply voltage ($V_{DD}$) is selected at 15 (volt). In this embodiment, the d.c. supply voltage ($V_{DD}$) of the d.c. voltage source 71 is selected at 10 (volt) so that the COS/MS AND gate is turned on by the input voltage greater than 4.5 (volt). COS/MOS digital integrated circuit of another type, for example that including OR gates, has the same voltage transfer characteristics as mentioned above. In the case of employing a display 5 having display segments of more than fifteen, it is preferable that the threshold value of the COS/MOS logica integrated circuit is selected at 6.8 (volt), in which the d.c. supply voltage ($V_{DD}$) of the d.c. voltage source 71 is selected at 15 (volt).

It is known to a person skilled in the art that application of alternating voltage across the electrodes of the liquid crystal segment produces a good effect on the life of the liquid crystal composition. For the purpose mentioned above, the pulse generator 6 and the display actuator 4 having the fifteen exclusive OR gates 40 to 415 are provided.

The composition of the liquid crystal segment in this case has the characteristics that it can be activated when it is energized by the voltage twice as large as the output voltage from the exclusive OR gate. Further, it is preferable than the AND gates of the comparator 3 and the exclusive OR gates of the dislay actuator 4 are constructed on one semiconductor chip as an integrated circuit.

Figure 3:
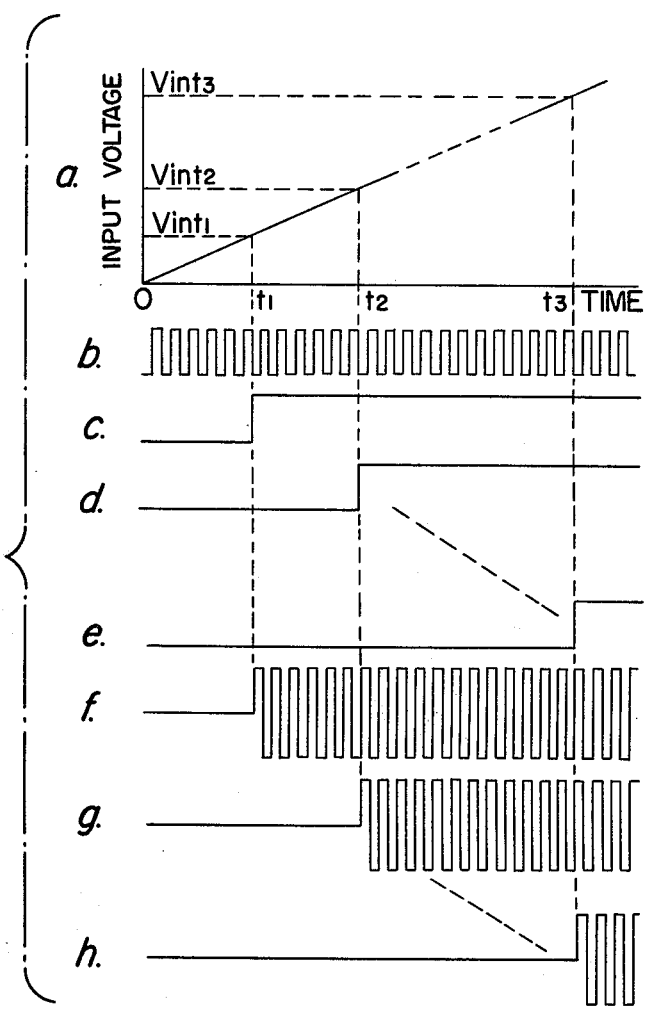
FIG. 3 shows the waveforms (a) to (h) of the voltage at various portions of the embodiment shown in FIG. 1 for explanation of operation.

The operation of the circuit mentioned above will be discribed hereinafter with reference to FIGS. 3 waveforms (a) to (h). Referring to FIG. 3(a), there is illustrated the anaogue input voltage increasing in proportion to time, for the easy understanding of the operation. The voltage at each junction which is represented by each of the above mentioned equations (1) to (5) varies in accordance with the analogue input voltage. In FIG. 3(a), $V_{int1}$ indicates the analogue input voltage applied to the input terminal 1 when the voltage at the junction 202 is at the above mentioned threshold value of the AND gate. Similarly, $V_{int2}$ and $V_{int3}$ indicate that when the voltages at the junctions 203 and 216 are at the threshold value respectively.

When the analogue input voltage is less than $V_{int1}$ (0–T1), voltages at the junctions 202 to 216 are less than the threshold value of the AND gate even though the voltage at the junctions 201 may be greater than that threshold value. Accordingly, all the AND gates 301 to 315 provide at the output terminals thereof output signals at "9" level which is nearly equal to ground. Each of the "0" outut signals is applied to the lower input terminal of corresponding exclusive OR gates 401 to 415. At the same time, the pulse generator supplies a1 of the upper input terminals of the exclusive OR gates 401 to 415 with the pulse signal which is shown in FIG. 3(b). The peak value of the pulse signal is settled at nearly equal to the d.c. supply voltage of the d.c. voltage source 71. Because all the lower input terminals of the exclusive OR gates 401 to 415 are supplied with the "0" output signal from the AND gates 301 to 315, all the exclusive OR gates 401 to 405 provide output signals similar to the pulse signal from the pulse generator 6 in the phase and peak value therof. The output pulse signals of the exclusive OR gates 401 to 415 are applied to the electrodes on the left hand side of the liquid crystal segments 501 to 515 respectively, while the pulse signal from the pulse generator 6 is applied to all electrodes on the right hand side thereof. The voltages, as shown in FIGS. 3(f) to (h), are not applied across the electrode of any liquid crystal segments 501 to 511. Therefore, none of the liquid crystal segments 501 to 511 is energized and activated.

When the analogue input voltage is greater than $V_{int1}$ and less than $V_{int2}$ (t1 – t2), the voltages at the junctions 201 and 202 come to greater than the threshold value and the voltages at the junctions 203 to 215 are less than that. In this case, the AND gate 301 provides an output signal at "1" level, which is nearly equal to the d.c. voltage source 71 as shown in FIG. 3(c) and the other AND gates 302 to 315 maintain the "0" output signals.

Accordingly, the exclusive OR gates 402 to 415 provide the output pulse signals similar to the pulse signal from the pulse generator 6, and the liquid crystal segments 502 to 414 are not energized and activated. On the other hand, the exclusive OR gate 401 provides an output pulse signal which has a phase difference of 180° from the pulse signal from the pulse generator 6, because it receives the "1" output signal from the AND gate 301 at the lower input terminal thereof. Such voltage is applied across the electrodes of the liquid crystal segment 501 as shown in FIG. 3(f). The liquid crystal composition of the liquid crystal segment 501 is, therefore, energized and activated upon the application of the alternating voltage greater than the threshold voltage thereof.

The number of the liquid crystal segments which are energized and activated increases in accordance with the increase of the analogue input voltage. In FIGS. 3(d) and (f), there are illustrated waveforms of output signal are the AND gate 302 and the alternating voltage applied across the electrodes of the liquid crystal segment 502 respectively. The AND gate 302 provides the "1" output signal in the range of the analogue input voltage greater than $V_{int2}$ and less than $V_{int3}$ (t2 − t3). Further, the waveforms of the output signal from the AND gate 315 and the alternating voltage applied across the electrodes of the liquid crystal segments 515 are shown in FIGS. 3(e) and (h), when the analogue input voltage is greater than $V_{int3}$. In this case, all of the liquid crystal segments 501 to 515 are energized and activated.

Figure 4:
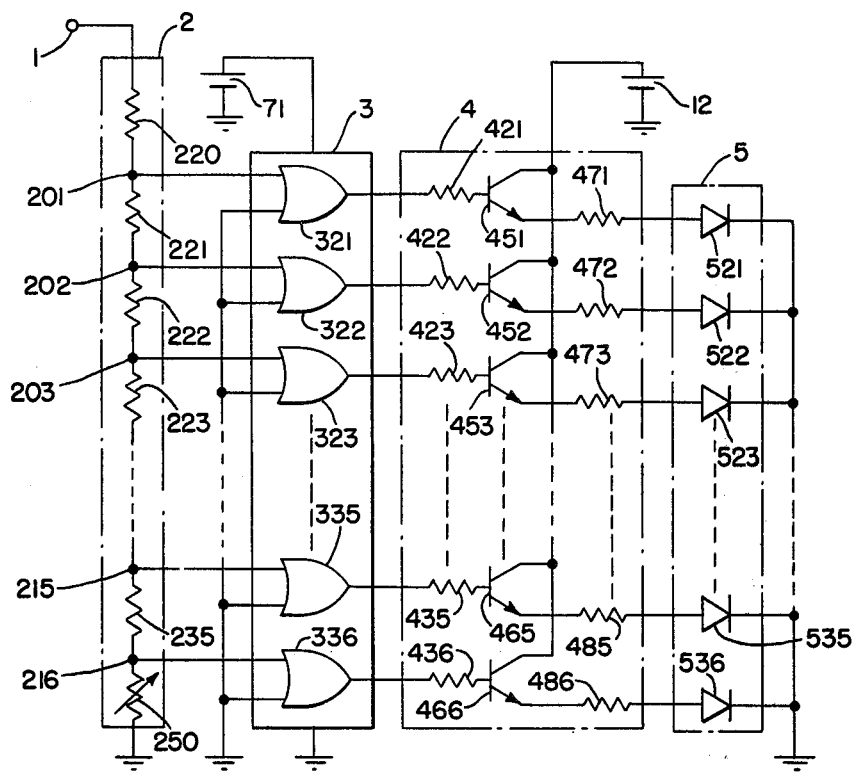
FIG. 4 is a schematic diagram of another embodiment having a display composed of luminescent diodes.

Referring now to FIG. 4, there is shown another embodiment for actuating a display 5 composed of sixteen luminescent diodes 521 to 536. The analogue input voltage applied to the input terminal 1 is also divided by the same resistance means 2 as shown in FIG. 1. An integrated circuit 3 operating as the comparator is constructed with sixten OR gates 321 to 336. The OR gate also has the same voltage transfer characteristics as shown in FIG. 2. Each of the junctions 201 to 216 is connected to an upper input terminal of a corresponding one of the OR gates 321 to 336. All of lower input terminals of the OR gates 321 to 336 are rounded. Accordingly, each of the OR gates 321 to 336 provides the "1" output signal when the voltage at corresponding juncton of the resistance means 2 exceeds the threshold value thereof. Each output terminal of the OR gates 321 to 336 is connected to one terminal of corresponding resistors 421 to 436, the other terminals of which are connected to bases of the transistors 451 to 466 respectively. Collectors of all the transistors 451 to 466 are connected to another d.c. voltage source 72. Each emitter of the transistors 451 to 466 is connected to one terminal of corresponding resistors 471 to 486. The other terminals of the resistors 471 to 486 are connected to anodes of the luminescent diodes 521 to 536 respectively, all of cathodes of which are grounded.

Figure 6:
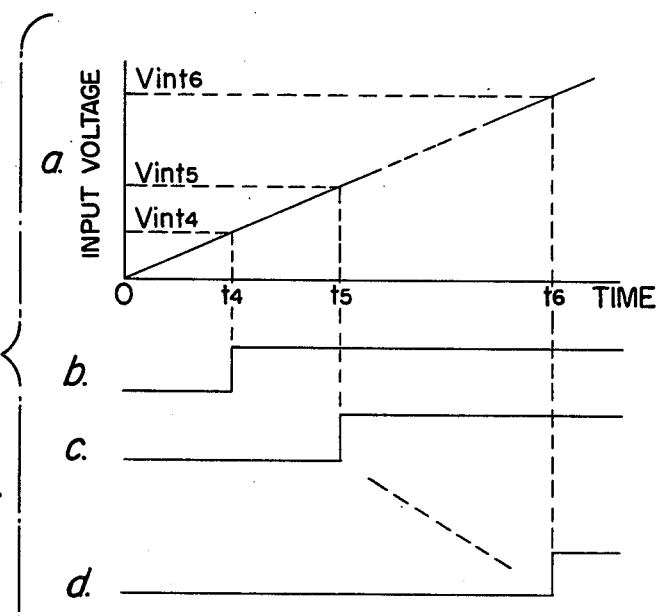
FIG. 6 shows the waveforms (a) to (d) the waveforms of voltages and current at various portions of the embodiment shown in FIG. 4.

The operation of the circuit shown in FIG. 4 will be explained with reference to FIGS. 6 waveforms (a) to (d) hereinafter. The analogue input voltage is shown in FIG. 6(a). In this figure, $V_{int4}$ indicates the analogue input voltage applied to the input terminal 1 when the voltage at the junction 201 is at the threshold value of the OR gate. $V_{int5}$ indicates the analogue input voltage when the voltage at the junction 202 is at the threshold value. When the analogue input voltage is less than V hd int4 (0 − t4), voltages less than the threshold value appear at the junctions 201 sto 216, each of which is connected to the upper input terminal of corresponding OR gates 321 to 336. All the OR gates 321 to 336 provide the "0" output signals at the bases of the transistors 451 to 466 of the display actuator 4. Therefore, none of the transistors 451 to 466 is turned on. None of the luminescent diodes 521 to 536 is energized to radiates the light.

When the analogue input voltage is greater than $V_{int4}$ and less than $V_{int5}$ (t4 − t5), the voltage at the junction 201 is greater than the threshold value of the OR gate and the voltages at the other junctions 202 to 216 or less than that. Only the OR gate 321 provides the "1" output signal at the base of the transistor 451. The transistor 451 is turned on by the "1" output signal. Therefore, current of saturated value flows from the d.c. voltage source through the collector and the emitter of the turned-on transistor 451, the resistor 471 and the luminescent diode 512 to ground as shown in FIG. 6(b). The luminescent diode 521 is energized and radiates the light.

In FIG. 6(c), there is shown the waveform of the current which flows through the luminescent diode 522 when the analogue input voltage is greater than $V_{int4}$ and less than $V_{int5}$(t4 − t5).

The number of the luminescent diodes which are energized increases in accordance with the increase of the analogue input voltage applied to the input terminal 1.

When the analogue input voltage is greater than $V_{int6}$, all the OR gates 321 to 336 provide the "1" output signals at the base of the transistors 451 to 466, where $V_{int6}$ means the input voltage applied when the voltage at the junction 216 is at the threshold value of the OR gate. Accordingly, all the transistors 451 to 466 are turned on. All the luminescent diodes 521 to 536 are energized to radiate the light.

In the embodiment shown in FIG. 4, the display actuator 4 and the display 5 can be replaced by another display circuit, for example the display actuator and the display shown in FIG. 1. In this case, the integrated circuit having sixteen exclusive OR gates and the display having sixteen liquid crystal segments are used.

Figure 5:
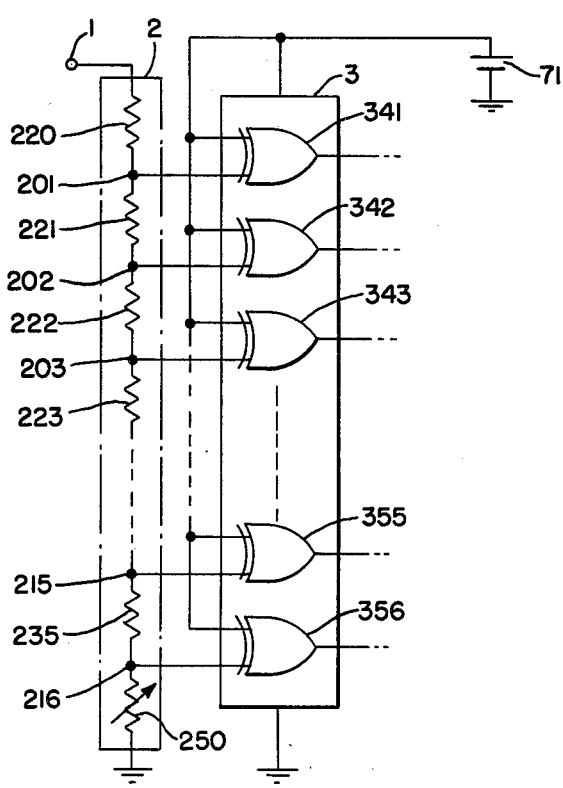
FIG. 5 is a schematic diagram showing a comparator of another kind which employs exclusive OR gates.

In FIG. 5, there is shown aother integrated circuit 3 which achieves the same function as the comparator 3 in the embodiments shown in FIGS. 1 and 4. The integrated circuit 3 has sixteen exclusive OR gates 341 to 356. A positive d.c. voltage supply terminal is connected to the d.c. voltage source 71 and negative one thereof is grouned. All of upper input terminals of the exclusive OR gates 341 to 356 are also connected to the d.c. voltage source 71. Each of lower input terminals of the exclusive OR gates 341 to 356 is connected to corresponding junctions 201 to 216 of the resistance 2. The integrated circuit 3 mentioned above can be used as the comparator in the embodiments shown in FIG. 1 and 4.

Further, another kind of logical circuits, for example NAND gates and NOR gates can be utilized for the comparator.

What we claim is:

1. In a display circuit for actuating display segments in accordance with an analogue input voltage comprising input means supplied with the analogue input voltage, voltage divider means connected to said input means including a plurality of resistors connected in series for dividing the analogue input voltage applied to said input means, comparing means connected to said voltage divider means for comparing the divided input voltages with at least one reference voltage to determine the number of the display segments to be activated and actuating means for driving the display segments response to the output from said comparing means, said comparing means including a logical circuit of at least one metal oxide semiconductor of the type having a threshold voltage which is dependent on the supply voltage applied thereto, the threshold voltage of the semiconductor being utilized for said at least one reference voltage.

2. A display circuit as claimed in claim 1, wherein said logical circuit comprises a plurality of OR gates, one of the terminals of each OR gate being connected to a corresponding one of the junctions of the resistors connected in series and the other terminal thereof being to ground.

3. A display ciruit as claimed in claim 1, wherein said logical circuit comprises a plurality of exclusive OR gates, one of the terminals of each exclusive or gate being connected to a corresponding one of the junctions of the resistors connected in series and the other terminal thereof being supplied with a constant voltage.

4. In a display circuit for actuating display segments in accordance with an analogue input voltage comprising input means supplied with the analogue input voltage, voltage divider means connected to said input means including a plurality of resistors connected in series for dividing the analogue input voltage applied to said input means, comparing means connected to said voltage divider means for comparing the divided input voltages with at least one reference voltage to determine the number of the display segments to be activated and actuating means for driving the display segments response to the output from said comparing means, said comparing means including a logical circuit of at least one metal oxide semiconductor having a gating threshold voltage, the threshold voltage of the semiconductor being utilized for said at least one reference voltage, said logical circuit comprising a plurality of AND gates, one of the terminals of each AND gate being connected to a corresponding one of the junctions of the resistors connected in series and the other terminal thereof being connected to the adjacent junction thereof.

* * * * *